United States Patent [19]

Oyama

[11] Patent Number: 5,406,699
[45] Date of Patent: Apr. 18, 1995

[54] METHOD OF MANUFACTURING AN ELECTRONICS PACKAGE

[75] Inventor: Kenshu Oyama, Ogouri, Japan

[73] Assignee: Matsushita Electric Industrial Co., Ltd., Osaka, Japan

[21] Appl. No.: 175,666

[22] Filed: Dec. 30, 1993

Related U.S. Application Data

[63] Continuation of Ser. No. 45,389, Apr. 13, 1993, abandoned.

[30] Foreign Application Priority Data

Sep. 18, 1992 [JP] Japan ................. 4-249066

[51] Int. Cl.$^6$ ........................................... H01R 43/00
[52] U.S. Cl. ..................................... 29/827; 174/52.2; 257/666; 437/219
[58] Field of Search .......................... 29/827; 174/52.2; 437/219; 257/666, 668

[56] References Cited

U.S. PATENT DOCUMENTS

| | | | |
|---|---|---|---|
| 3,404,319 | 10/1968 | Tsuji et al. | 257/666 |
| 3,469,684 | 9/1969 | Keady et al. | 29/827 X |
| 3,706,840 | 12/1972 | Moyle et al. | 437/219 X |
| 3,839,660 | 10/1974 | Stryker | 174/52.2 X |
| 4,079,511 | 3/1978 | Grabbe | 29/827 |
| 4,758,875 | 7/1988 | Fujisaki et al. | 257/790 |
| 4,769,344 | 9/1988 | Sakai et al. | 257/790 |
| 4,827,328 | 5/1989 | Ozawa et al. | 174/52.2 X |
| 5,070,390 | 12/1991 | Shimizu | 257/668 |

FOREIGN PATENT DOCUMENTS

| | | | |
|---|---|---|---|
| 0175489 | 3/1986 | European Pat. Off. | 257/790 |
| 210371 | 2/1987 | European Pat. Off. | 257/668 |
| 2230863 | 10/1991 | Germany | 257/790 |
| 61-189656 | 8/1986 | Japan | 257/790 |
| 62-119945 | 6/1987 | Japan | 257/790 |
| 62-174956 | 7/1987 | Japan | 257/790 |
| 62-263662 | 11/1987 | Japan | 257/790 |
| 63-114241 | 5/1988 | Japan | 257/790 |
| 1-215049 | 8/1989 | Japan | 257/790 |
| 384958 | 4/1991 | Japan . | |
| 3120851 | 5/1991 | Japan . | |
| 3278561 | 12/1991 | Japan . | |

*Primary Examiner*—Carl J. Arbes
*Attorney, Agent, or Firm*—Lowe, Price, LeBlanc & Becker

[57] ABSTRACT

An electronics package is provided with a substrate on which a patterned circuit is printed, a plurality of conductive leads connected to the patterned circuit along the periphery of the substrate, a first mold body arranged along the periphery of the substrate to reinforce the connection of the conductive leads to the patterned circuit, a plurality of chips attached on the substrate, a plurality of bonding wires connecting an integral circuit formed in each of the chips to the patterned circuit, and a second mold body arranged over the chips and the substrate. The second mold body functions as an insulating protector to protect the chips from an external obstacle and corrosive gases. An electric signal applied to one of the conductive leads is transferred to one of the chips through the patterned circuit and one of the bonding wires. The electric signal is processed in the chip to produce an output signal. The output signal is transferred to another conductive lead through another bonding wire and the patterned circuit. Because a plurality of chips are arranged in the electronics package, the chips can be integrated at a high degree.

12 Claims, 15 Drawing Sheets

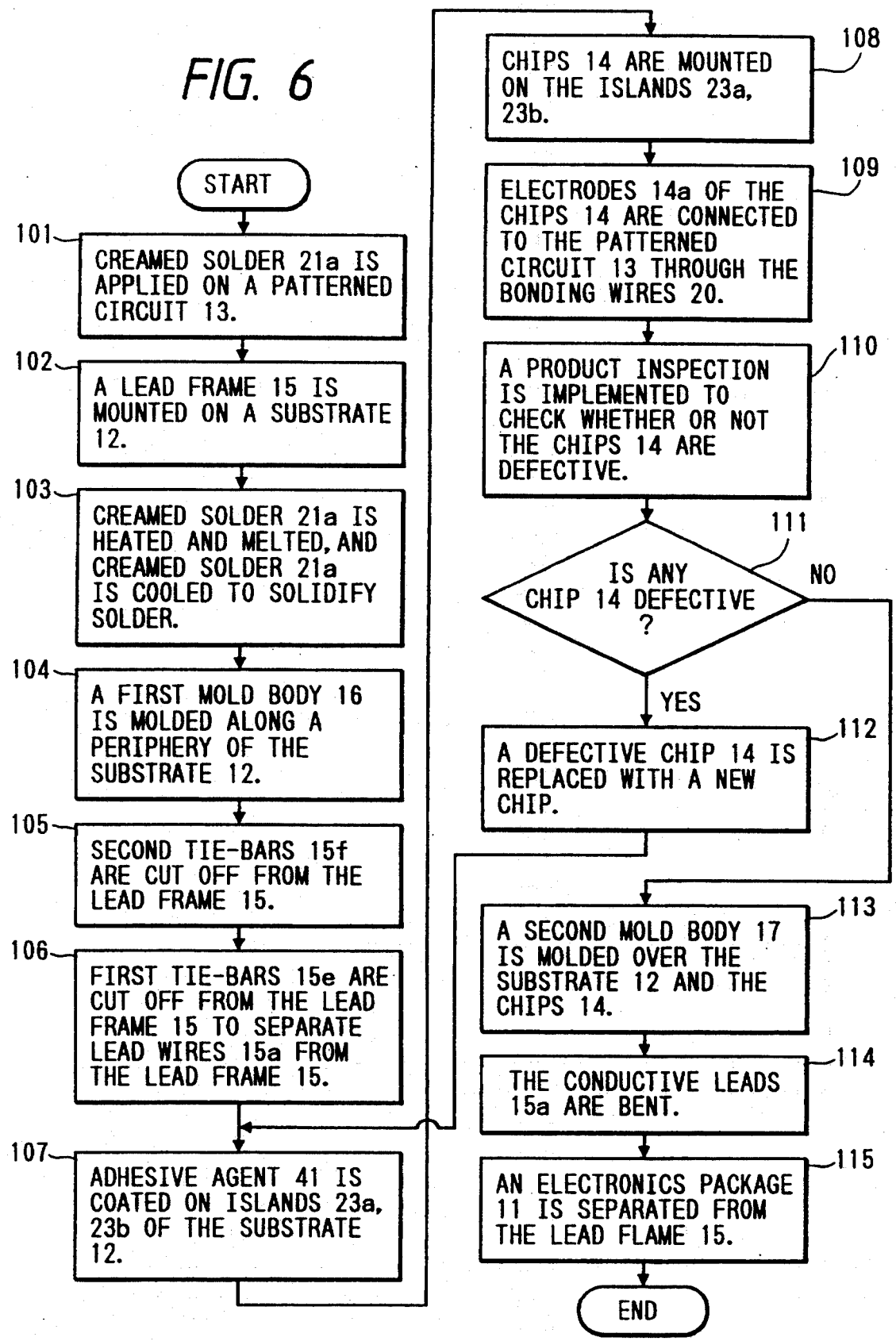

METHOD OF MANUFACTURING AN ELECTRONICS PACKAGE

This is a continuation of application Ser. No. 08/045,389, filed Apr. 13, 1993, now abandoned.

BACKGROUND OF THE INVENTION

1. Field of the Invention

The present invention relates to a method for efficiently manufacturing the electronics package at a low fraction of defective chips.

2. Description of the Related Art

A conventional electronics package includes a molding body and a bare chip accommodated in the molding body. In this case, the bare chip functions as one of electronic parts. Also, it has been recently required to manufacture the electronic parts at a high integration, so that it is necessary to accommodate a plurality of bare chips in an electronics package at a high integration. Also, it is necessary to efficiently manufacture a large number of electronics packages.

3. Problems to be Solved by the Invention

However, it is difficult to efficiently manufacture each of the electronics packages at a low fraction defective. Also, it is difficult to accommodate a plurality of bare chips in the electronics package without any defective bare chip.

Also, a product inspection is conventionally implemented to check whether or not each of the electronics packages is defective. In detail, a series of completed electronics packages is carried by a conveyer along an inspection line. Each of the completed electronics packages has a plurality of lead frames projected from a molding body thereof. Therefore, each of the completed electronics packages are inspected by an inspecting apparatus arranged along the inspection line. That is, a pair of probes of the inspecting apparatus is in contact with a pair of lead frames of each of the completed electronics packages, and an electric current value flowing through one of bare chips or a signal transferred through one of the bare chips is measured or inspected. Therefore, each of the bare chips accommodated in each of the electronics packages is inspected.

However, in cases where it is checked on the product inspection that at least one of the bare chips accommodated in a certain electronics package is defective, the electronics package is judged to be defective even though other bare chips accommodated in the electronics package are non-defective. In addition, the electronics package judged to be defective is abandoned.

Accordingly, it is important to efficiently manufacture an electronics package in which a plurality of bare chips are accommodated without any defective bare chip at a high integration.

Also, in cases where it is checked on the product inspection that one of the bare chips is defective, it is important that the bare chip defective is easily replaced with a non-defective bare chip.

SUMMARY OF THE INVENTION

A first object of the present invention is to provide, with due consideration to the drawbacks of such a conventional electronics package, an electronics package in which a plurality of bare chips are accommodated without any defective bare chip at a high integration.

Also, a second object of the present invention is to provide a method for efficiently manufacturing an electronics package.

The first object is achieved by the provision of an electronics package, comprising:
- a substrate having a patterned circuit mounted thereon;
- a plurality of chips mounted on tile substrate and electrically connected to the patterned circuit on the substrate;
- a first insulating member mounted on peripheries of both sides of the substrate;
- a plurality of conductive leads outwardly extending from the patterned circuit on the substrate and passing through the first insulating member; and
- a second insulating member covering the chips and the patterned circuit on the substrate.

In the above configuration, an input signal is transferred from the outside to one of the chips through one of the conductive leads and the patterned circuit. Also, an output signal is transferred from one of the chips to the outside through one of the conductive leads and the patterned circuit. Therefore, the chips function as electric parts. In this case, because a plurality of chips are arranged on the substrate, the electric parts can be arranged at a high integration.

Accordingly, an electronic apparatus composed of a large number of chips can be miniaturized.

Also, the first object is achieved by the provision of an electronics package, comprising:
- a substrate on which a patterned circuit is provided;
- a plurality of conductive leads connected to outer ends of the patterned circuit on the substrate, the conductive leads being arranged along a periphery of the substrate;
- an insulating mold body arranged along the periphery of the substrate to reinforce connection of the conductive leads to the patterned circuit on the substrate;
- a plurality of chips which are attached on the substrate and are connected to inner ends of the patterned circuit on the substrate, inner circuits formed in the chips being respectively connected to tile patterned circuit on the substrate; and
- an insulating protector arranged over the chips to protect the chips from an external obstacle.

In the above configuration, an input signal is transferred to one of the chips through one of the conductive leads and the patterned circuit. The input signal is processed in the inner circuit of the chip so that an output signal is transferred from the chip to an external equipment through the patterned circuit and another conductive lead.

In this case, because a plurality of chips are arranged on the substrate, the chips functioning as electric parts can be arranged at a high integration. Therefore, an electronic apparatus composed of a large number of chips can be miniaturized. Also, the input signal can be rapidly processed.

It is preferred that a conductive wire connect each of the inner circuits of the chips with the patterned circuit on the substrate.

In the above configuration, the input signal can be reliably transferred to the inner circuit through one of the bonding wires. Also, the output signal can be reliably transferred to the patterned circuit through another bonding wire.

Also, it is preferred that each of the chips be formed of a flip chip on which a conductive bump is arranged, and the conductive bump be connected to one of the inner ends of the patterned circuit.

In the above configuration, each of the flip chips is electrically and mechanically connected to the patterned circuit through the conductive bump even though no bonding wire is arranged between the flip chip and the patterned circuit.

Accordingly, the flip chips can be reliably connected to the patterned circuit. Also, the fraction defective of the electronics package can be reduced because no bonding wire is required.

Also, it is preferred that the insulating protector be formed of an insulating synthetic resin layer coated over the chips and the substrate which is surrounded by the insulating mold body.

In the above configuration, the chips are buried in the insulating synthetic resin. Therefore, even though the electronics package is collided with the external obstacle, the chips are not damaged because the chips are protected by the insulating synthetic resin.

Also, it is preferred that the insulating protector be an insulating plate arranged above the chips.

In the above configuration, the chips are concealed behind the insulating plate. Therefore, even though the electronics package is collided with the external obstacle, the chips are not damaged because the chips are protected by the insulating plate.

Also, it is preferred that the conductive leads be respectively connected with the patterned circuit on the substrate through a solder layer of which a melting point is high.

In the above configuration, even though the insulating mold body is molded after the: insulating mold body is heated, the conductive leads connected to the patterned circuit do not come off because the melting point of the solder layer is enough high.

Also, it is preferred that the electronics package additionally include a main substrate on which the insulating mold body is mounted to position the chips and the insulating protector on the substrate, a main patterned circuit provided on the main substrate being connected to the conductive leads.

In the above configuration, a large number of electronics package is mounted on the main substrate to make an electronic apparatus. That is, an input signal is transferred from the main patterned circuit on the main substrate to one of the electronics package through one of the conductive leads. Also, an output signal is transferred from the chip to the main patterned circuit through another conductive lead.

Accordingly, a large number of chips can be set in the electronics apparatus at a high integration.

Also, it is preferred that the electronics package additionally include a main substrate on which the insulating mold body is mounted to put the chips and the insulating protector between the substrate and the main substrate, a main patterned circuit provided on the main substrate being connected to the conductive leads.

In the above configuration, an upper surface of the substrate is flat. Therefore, the electronics package can be easily transferred on the main substrate by adsorbing the flat surface with an evacuated nozzle of a transferring equipment. Also, even though the electronics package is collided with the external obstacle, the chips are not damaged because the chips are protected not only by the insulating protector but also by the substrate.

The second object is achieved by the provision of a method of manufacturing an electronics package, comprising the steps of:
preparing a substrate on which a patterned circuit is provided;
preparing a lead frame comprising a plurality of conductive leads, a tie-bar with which the conductive leads are tied, and a supporting bar;
attaching the substrate to the lead frame while connecting the patterned circuit on the substrate to the conductive leads of the lead frame;
forming an insulating mold body along a periphery of the substrate to cover a connecting section between the patterned circuit and the conductive leads, the supporting bar of the lead frame being fixed to the substrate by the insulating mold body;
cutting off the tie-bar of the lead frame from the lead frame to support the substrate with the supporting bar of the lead frame;
attaching at least one chip on the substrate to connect an inner circuit of the chip to the patterned circuit on the substrate;
arranging an insulating protector over the chip to protect the chip from an external obstacle; and
cutting off the supporting bar of the lead frame from the substrate to separate the substrate from the lead frame, an electronics package which comprises the substrate, the conductive leads, the chip, the insulating mold body, and the insulating protector being manufactured.

In the above steps of the method, the substrate is integrally attached to the lead frame in a first process. In this case, the patterned circuit is connected to the conductive leads. Therefore, it is easy to support and transfer the substrate without touching the substrate because the lead frame can be utilized as a supporter and a carrier. That is, the substrate is supported with the lead frame when the insulating mold body is formed in a second process to cover the connecting section between the patterned circuit and the lead frames. In this case, the connecting section is reinforced by the insulating mold body.

After the conductive leads are firmly attached to the patterned circuit, the tie-bar of the lead frame is cut off in a third process because the tie-bar is not necessary. Therefore, the substrate is attached to the lead frame only through the supporting bar.

In a fourth process, one or more chips are attached on the substrate. Each of the chips functions as one of electronics parts.

In a fifth process, the insulating protector is arranged to protect the chips. That is, even though the insulating protector is collided with the external obstacle, the chips are not damaged. Also, even though the substrate is put in corrosive gases, the chips are not corroded.

In a sixth process, the supporting bar is cut off from the substrate so that the electronic package can be completely manufactured.

It is preferred that the step of attaching the substrate to the lead frame include:
applying creamed solder on outer ends of the patterned circuit provided on the substrate;
mounting the lead frame on the substrate, the creamed solder being put between the conductive leads and the outer ends of the patterned circuit;
heating the creamed solder to melt the creamed solder; and cooling the creamed solder to solidify solder included in the creamed solder.

In the above steps, the creamed solder can be applied on the outer ends of the patterned circuit at a room temperature. Thereafter, the creamed solder is heated to melt the cream solder. In this case, cream included in the creamed solder is vaporized. Therefore, when the creamed solder is cooled, solder included in the creamed solder is solidified to firmly connect the conductive leads to the outer ends of the patterned circuit.

Accordingly, the substrate can be easily and rapidly attached to the lead frame.

Also, it is preferred that the step of forming an insulating mold body include:

preparing a drag in which a spring-loaded block is arranged and a ring-shaped first groove is dug to surround the spring-loaded block, a ring-shaped first projecting portion being arranged at upper edge of the spring-loaded block;

preparing a cope facing the drag, the cope being moved up and down to change a distance between the drag and the cope, a second groove being drug in the cope to face the first groove of the drag, and a second projecting portion being arranged on the cope to face the first projecting portion of the drag;

preparing a casing in which a plunger is moved up and down, a hole being formed at a side of the casing to form an opening reaching from the casing to the first groove of the drag;

setting the substrate attached to the lead frame on the spring-loaded block, the lead frame being mounted on the drag;

putting a tablet type of synthetic resin on the plunger in the casing;

heating the tablet type of synthetic resin to melt the synthetic resin;

moving down the cope to put the lead frame between the drag and the cope, the substrate being put between the first projecting portion of the drag and the second projecting portion of the cope, and a cavity being formed of the first groove of the drag and the second groove of the cope;

moving up the plunger to push out the synthetic resin to the cavity through the opening;

cooling the synthetic resin filled in the cavity to solidify the synthetic resin, the insulating mold body being formed of the synthetic resin solidified in the cavity;

moving up the cope to separate an upper surface of the insulating mold body packed in the cavity from the cope, outside and bottom surfaces of the insulating mold body being separated from the drag by a spring action of the spring-loaded block;

lifting the substrate by pushing up a back surface of the substrate with an ejector pin, an inside surface of the insulating mold body being separated from the spring-loaded block; and taking out the substrate mounted on the spring-loaded block, the insulating mold body being formed along the periphery of the substrate.

In the above steps, the substrate is received by the first and second projecting portions when the cope is moved down to put the lead frame between the drag and the cope. Therefore, the substrate can be stably fixed even though the substrate does not have a flat surface.

Also, even though the substrate set on the spring-loaded block does not have a flat surface, the spring-loaded block is inclined by a spring action to horizontally set the lead frame between the drag and the cope. Therefore, the cavity arranged to surround the spring-loaded block is completely sealed between the drag and the cope when the cope is moved down.

Also, the tablet type of synthetic resin is set on the plunger. Therefore, it is easy to handle the tablet type of synthetic resin because the synthetic resin is not melted.

Also, after the tablet type of synthetic resin is set on the plunger, the synthetic resin is heated and melted. Therefore, the synthetic resin is easily pushed into the cavity which is completely sealed by the drag and the cope. Accordingly, the insulating mold body can be easily formed in the cavity.

Also, when the cope is moved up after the insulating mold body is formed in the cavity, the spring-loaded block is lifted by the spring action. Therefore, the insulating mold body formed along the periphery of the substrate and the substrate are lifted together. Accordingly, not only the upper surface of the insulating mold body is separated from the cope, but also the outside and bottom side surfaces of the insulating mold body are separated from the drag (a first separating step). However, the inside surface of the insulating mold body is still attached to the spring-loaded block.

Thereafter, the substrate is lifted by the ejector pin. Therefore, the inside surface of the insulating mold body is separated from the block (a second separating step). Accordingly, because the insulating mold body is separated from the cope, the drag and the block according to the first and second steps, the insulating mold body can be reliably separated.

Also, it is preferred that the step of attaching at least one chip include:

coating adhesive agent on the substrate;

mounting the chip on the substrate coated with the adhesive agent to attach the chip on the substrate; and arranging an insulating wire between the inner circuit of the chip and the patterned circuit.

In the above steps, the chip can be reliably attached on the substrate because the adhesive agent is coated on the substrate.

Also, the inner circuit of the chip is reliably connected to the patterned circuit on the substrate through the insulating wire.

Also, it is preferred that the step of attaching at least one chip include:

coating insulating adhesive agent on the substrate; and mounting a flip chip on the substrate to attach bumps arranged on the flip chip to the patterned circuit though the insulating adhesive agent.

In the above steps, the flip chip can be reliably attached on the substrate because the insulating adhesive agent is coated on the substrate.

Also, the inner circuit of the flip chip is reliably connected to the patterned circuit on the substrate through the bumps and the insulating adhesive agent.

Also, it is preferred that the step of arranging an insulating protector include:

applying a paste type of synthetic resin on the substrate to cover over the chip; and solidifying the paste type of synthetic resin, the insulating protector being formed of the synthetic resin solidified.

In the above steps, the chip attached on the substrate is buried into the synthetic resin solidified. Therefore, even though the synthetic-resin is collided with the external obstacle, the chip is not damaged.

Also, it is preferred that the step of arranging an insulating protector include:
applying adhesive resin on a surface of the insulting mold body surrounding the substrate; and
setting an insulating plate over the substrate while attaching the insulating plate on the surface of the insulating mold body on which the adhesive resin is applied.

In the above steps, the chip attached on the substrate is covered with the insulating plate. Therefore, even though the insulating plate is collided with the external obstacle, the chip is not damaged.

Also, it is preferred that the method additionally include implementing a product inspection to check whether or not the chip properly functions before the step of arranging an insulating protector.

In the above step, the product inspection is implemented to inspect the chip before the insulating protector is arranged. Therefore, in cases where the chip is defective, the chip can be replaced with another chip without being disturbed by the insulating protector.

Accordingly, the fraction defective of the electronics package can be reduced.

In addition, it is preferred that the step of implementing a product inspection include:
transferring the substrate just under a pair of probes;
contacting the probes with a pair of conductive leads to which the chip is connected; and
transferring an electric current from one of the probes to another probe to measure or detect an electric performance of the chip.

In the above step, the chip can be reliably checked whether or not the chip is defective.

BRIEF DESCRIPTION OF THE DRAWINGS

The objects features and advantages of the present invention will be apparent from the following description taken in conjunction with tile accompanying drawings, in which.

FIG. 6 is a flow chart showing a method for manufacturing the electronics package shown in FIG. 1 according to the first embodiment;

DETAIL DESCRIPTION OF THE PREFERRED EMBODIMENTS

Preferred embodiments of an electronics package and a method for manufacturing the electronics package according to the present invention are described with reference to drawings.

1. First Embodiment

A first embodiment of an electronics package is described with reference to FIGS. 1 to 3.

Figure 1:
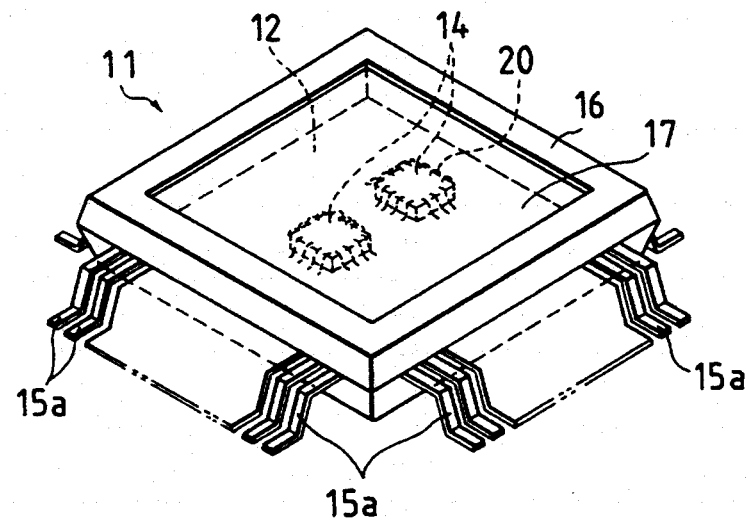
FIG. 1 is a diagonal view of an electronics package according to embodiment.

FIG. 1 is a diagonal view of an electronics package according to a first embodiment. FIG. 2 is a cross sectional view of the electronics package shown in FIG. 1. FIG. 3A is an enlarged view of a section A of the electronics package shown in FIG. 2. FIG. 3B is an enlarged view of a section B of the electronics package shown in FIG. 2. FIG. 3C is an enlarged view of a section C of the electronics package shown in FIG.

Figure 2:
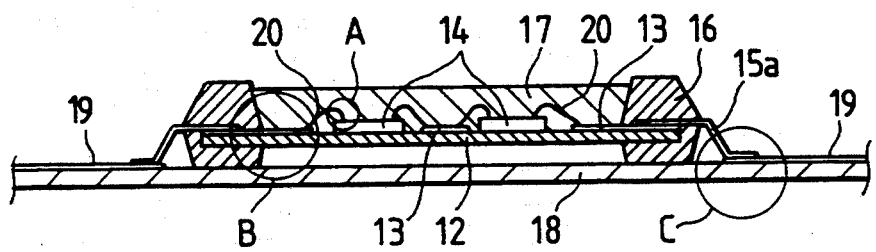
FIG. 2 is a cross sectional view of the electronics package shown in FIG. 1.
Figure 3A:
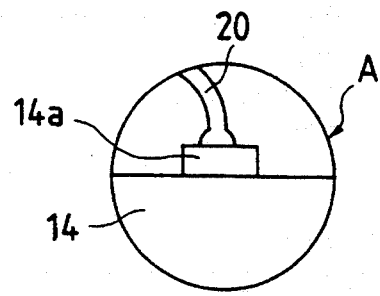
FIG. 3A is an enlarged view of a section A of the electronics package shown in FIG. 2.
Figure 3B:
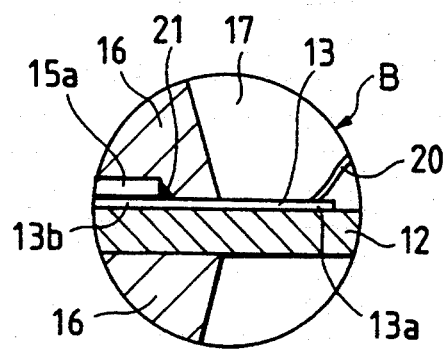
FIG. 3B is an enlarged view of a section C of the electronics shown in FIG. 2.
Figure 3C:
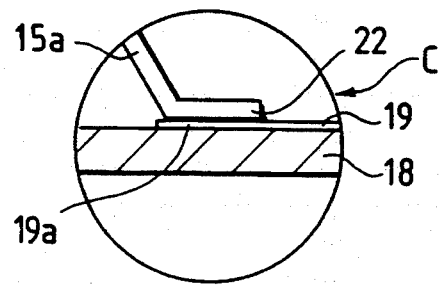
FIG. 3C is an enlarged view of a section C of the electronics package shown in FIG. 2.

As shown in FIGS. 1, 2, an electronics package 11 according to the first embodiment comprises an almost square-shaped substrate 12 on which a patterned circuit 13 is printed, a pair of chips 14 firmly attached on a central surface of the substrate 12, a plurality of conductive leads 15a which each are connected with the patterned circuit 13 printed on the substrate 12 and are arranged on a periphery of the substrate 12, a frame-shaped first insulating mold body 16 arranged at the periphery of the substrate 12, and a second insulating mold body 17 covering over an upper surface of the substrate 12 and the chips 14.

The substrate 12 is made of glass epoxy resin, ceramics, or the like.

The chips 14 are respectively formed of a bare chip cut out of a silicon wafer. An integrated circuit is formed in each of the chips 14 so that each of the chips 14 functions as one of electronic parts. Also, a plurality of chip electrodes 14a are arranged on a surface of each of the chips 14 in parallel with one another. Each of chip electrodes 14a is connected with an integrated circuit formed in a chip.

The first insulating mold body 16 is set on a main substrate 18 so that the electronics package 11 is surrounded by a main patterned circuit 19 printed on the main substrate 18.

The conductive leads 15a are projected from the substrate 12 outwardly in parallel with one another along the periphery of the substrate 12. Inner ends of the conductive leads 15a are firmly fixed by the first insulating mold body 16.

The second insulating mold body 17 is formed by solidifying melted synthetic resin after the melted synthetic resin is poured on the substrate 12 surrounded by the first insulating mold body 16.

As shown in FIG. 3A, each of the chip electrodes 14a is connected to the patterned circuit 13 printed on the substrate 12 through a bonding wire 20 made of gold. In detail, as shown in FIG. 3B, each of the bonding wires 20 is connected with one of inner ends 13a of the patterned circuit 13 printed on the substrate 12. Also, each of outer ends 13b of the patterned circuit 13 is firmly connected with one of the inner ends of the conductive leads 15a through a solder layer 21. In addition, as shown in FIG. 3C, each of outer ends of the conductive leads 15a is connected with one of main electrodes 19a of the main patterned circuit 19 printed on the main substrate 18 through a solder layer 22.

In the above configuration, a large number of electronics packages 11 according to the first embodiment are set on the main substrate 18 to make an electronic equipment.

When an electric signal is applied to the electronic equipment, the electric signal is transferred to a conductive lead 15a of an electronics package 11 through the main patterned circuit 19 printed on the main substrate 18. Thereafter, the electric signal is transferred to a chip 14 of the electronics package 11 through the patterned circuit 13 printed on the electronics package 11. The electric signal applied to the chip 14 is processed in the integrated circuit of the chip 14. Thereafter, processed signal is transferred to the main patterned circuit 19 through the patterned circuit 13, and the processed signal is output as an output signal from the electronic equipment.

In this case, because a plurality of chips 14 are arranged on the substrate 12, the chips 14 can be arranged on the electronic equipment at a high integration.

Therefore, the electronic equipment can be miniaturized. Also, the processing of the electric signal in the electronic apparatus can be rapidly executed.

Next, a method for connecting the patterned circuit 13 printed on the substrate 12 to the conductive leads 15a is described with reference to FIGS. 4, 5.

Figure 4:
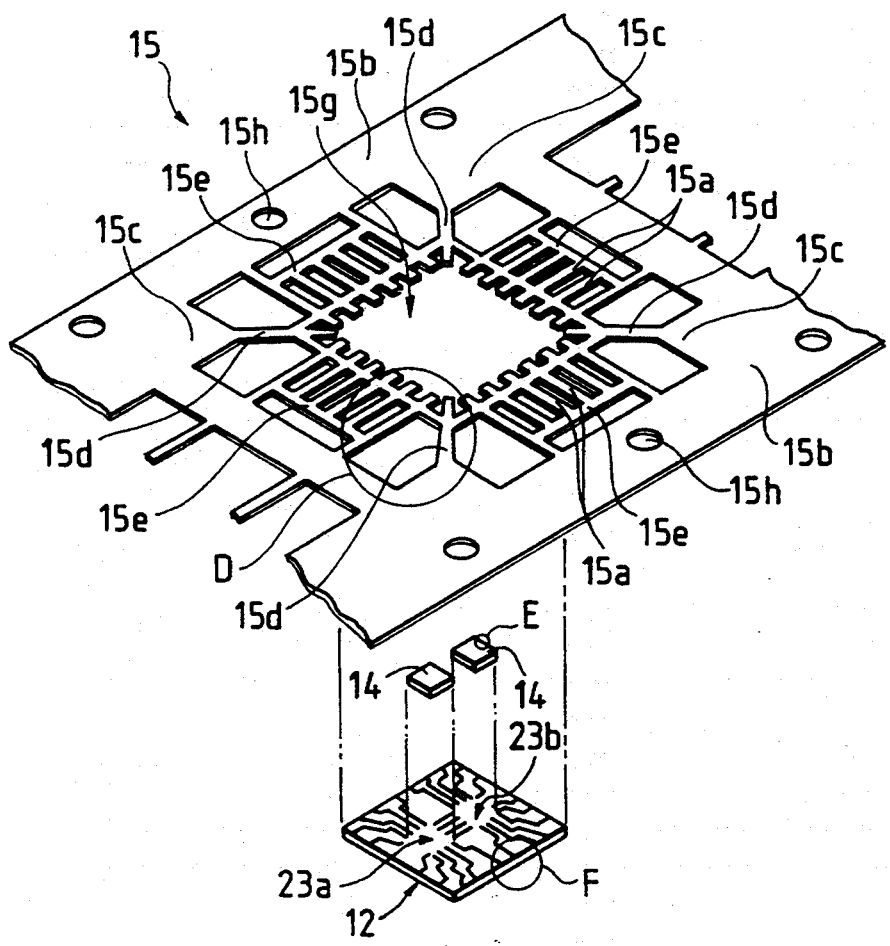
FIG. 4 is a diagonal view of a lead frame on which the substrate shown in FIG. 1 is mounted before the chips 14 shown in FIG. 1 are attached to the substrate.
Figure 5A:
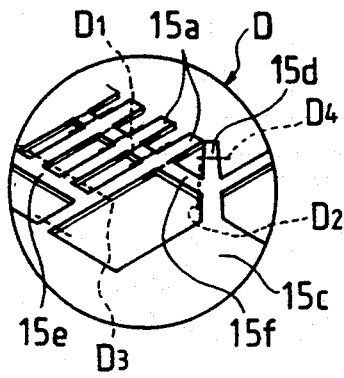
FIG. 5A is an enlarged view of a section D of the lead frame shown in FIG. 4.
Figure 5B:
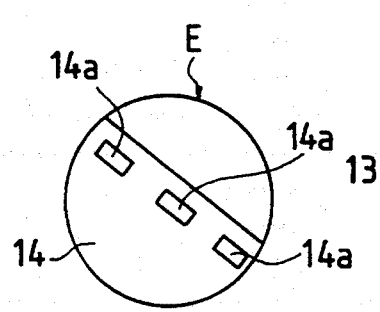
FIG. 5B is an enlarged view of a section E of the lead frame shown in FIG. 4.
Figure 5C:
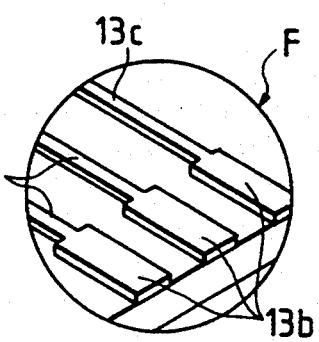
FIG. 5C, is an enlarged view of a section F of the lead frame shown in FIG. 4.

FIG. 4 is a diagonal view of a lead frame on which the substrate 12 is mounted before the chips 14 are attached to the substrate 12. FIG. 5A is an enlarged view of a section D of the lead frame shown in FIG. 4. FIG. 5B is an enlarged view of a section E of the lead frame shown in FIG. 4. FIG. 5C is an enlarged view of a section F of the lead frame shown in FIG. 4.

A lead frame 15 has a plurality of square-shaped blocks, and one of the square-shaped blocks is shown in FIG. 4. The square-shaped blocks are arranged in series in a longitudinal direction of the lead frame 15.

As shown in FIGS. 4, 5A, one of the square-shaped blocks in the lead frame 15 comprises a frame-shaped base portion 15b, four corner portions 15c arranged at corners of the base portion 15b, four supporting bars 15d inwardly projected from the corner portions 15c, the conductive leads 15a arranged at four sides of the base portion 15b, four first tie-bars 15e which each tie with the conductive leads 15a positioned at one side of the base portion 15b, and four second tie-bars 15f which each tie with the conductive leads 15a positioned at one side of the base portion 15b in cooperation with each of the first tie-bars 15e.

A square-shaped central opening portion 15g is surrounded by the conductive leads 15a and the supporting bars 15d in a center of one block of the lead frame 15. The conductive leads 15a inwardly extend toward the central opening portion 15g. Also, the conductive leads 15a arranged at each of the sides of the base portion 15b are tied with the first and second tie-bars 15e, 15f arranged in parallel to each other.

Also, a plurality of pin holes 15h are formed in the base portion 15b along the longitudinal direction of the lead frame 15. The pin holes 15h are utilized to position the substrate 12 arranged at the central opening portion 15g of the lead frame 15.

As shown in FIG. 5B, the chip electrodes 14a are arranged on upper surfaces of the chips 14. Also, as shown in FIG. 5C, the patterned circuit 13 printed on the substrate 12 includes the inner ends 13a, the outer ends 13b, and middle circuit lines 13c which each are connected with both one of the inner ends 13a and one of the outer ends 13b. The width of the outer ends 13b is wider than the width of the middle circuit lines 13c. Therefore, the outer ends 13b of the patterned circuit 13 are easily connected to the conductive leads 15a through the solder layer 21. Also, island portions 23A, 23B surrounded by the inner ends 13a of the patterned circuit 13 are formed on the substrate 12. The chips 14 are attached on the island portions 23A, 23B of the substrate 12 after the substrate 12 is set in the opening section 15b.

Next, a method for manufacturing the electronics package 11 according to the first embodiment is described with reference to FIGS. 6 to 11.

Figure 7A:
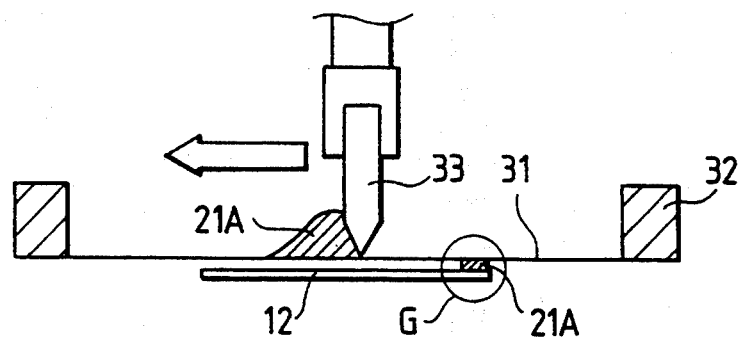
FIGS. 7A to 7D are respectively a diagonal view of the electronics package manufactured according to the method shown in FIG. 6.
Figure 7B:
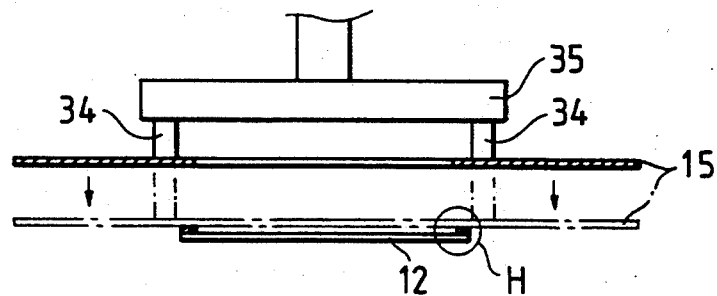

FIG. 6 is a flow chart showing a method for manufacturing the electronics package 11 according to the first embodiment. FIGS. 7A to 7D are respectively a diagonal view of the electronics package 11 manufactured according to the method shown in FIG. 6. FIG. 7E is an enlarged view of a section G of the electronics package 11 shown in FIG. 7A. FIG. 7F is an enlarged view of a section H of the electronics package shown in FIG. 7B. FIG. 7G is an enlarged view of a section I of the electronics package 11 shown in FIG. 7C.

As shown in FIG. 6, creamed solder 21a is applied on the outer ends 13b of the patterned circuit 13 printed on the substrate 12 by utilizing a screen printing machine (not shown) in a step 101. In detail, as shown in FIGS. 7A, 7E, a screen mask 31 supported by a mask holder 32 of the screen printing machine is put on the upper surface of the substrate 12. In this case, the creamed solder 21a is set on the screen mask 31 in advance. Also, a plurality of patterned holes 31a are opened in the screen mask 31. The patterned holes 31a are positioned just above the outer ends 13b of the patterned circuit 13.

Thereafter, a squeegee 33 is slid on the screen mask 31 in a horizontal direction so that the creamed solder 21a is pushed into the patterned holes 31a. Therefore, the outer ends 13b of the patterned circuit 13 are coated by the creamed solder 21a pushed into the patterned holes 31a.

In a step 102, the lead frame 15 is mounted on the substrate 12 in which the outer ends 13b of the patterned circuit 13 are coated by the creamed solder 21a. In detail, as shown in FIG. 7B, the lead frame 15 is held by suction nozzles 34 projected from a transferring head 35. Thereafter, the lead frame 15 held by the suction nozzles 34 is transferred on the substrate 12, and the lead frame 15 is put on the substrate 12. In this case, as shown in FIG. 7F, the lead frame 15 put on the substrate 12 is accurately positioned to connect the conductive leads 15a of the lead frame 15 with the outer sides 13b of the patterned circuit 13 through the creamed solder 21a.

Figure 7C:
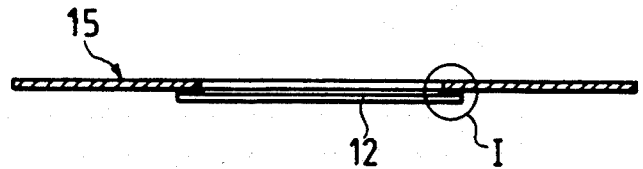
Figure 7D:
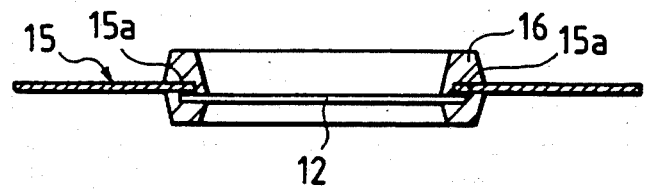
Figure 7E:
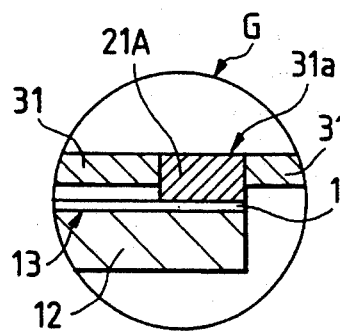
FIG. 7E is an enlarged view of a section G of the electronics package shown in FIG. 7A.
Figure 7F:
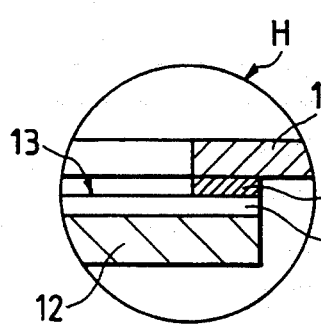
FIG. 7F is an enlarged view of a section H of the electronics package shown in FIG. 7B.
Figure 7G:
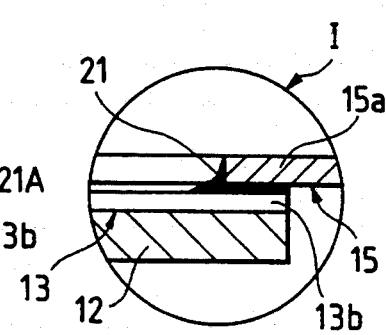
FIG. 7G is an enlarged view of a section I of the electronics pac shown in FIG. 7C.

In a step 103, as shown in FIGS. 7C, 7G, the creamed solder 21a put between the outer sides 13b of the patterned circuit 13 and the conductive leads 15a of the lead frame 15 is heated and melted. Thereafter, the creamed solder 21a melted is cooled to solidify solder included in the creamed solder 21a. Therefore, the conductive leads 15a of the lead frame 15 are connected with the outer sides 13b of the patterned circuit 13 through the solder layers 21.

In a step 104, as shown in FIG. 7D, the first mold body 16 is molded in a doughnut shape along the periphery of the substrate 12 to cover the connection between the conductive leads 15a of the lead frame 15 and the outer sides 13b of the patterned circuit 13. Therefore, the connection is firmly reinforced by the first mold body 16. In addition, the supporting bars 15d of the main frame 15 are firmly attached to the substrate 12 by the first mold body 16.

Figure 8:
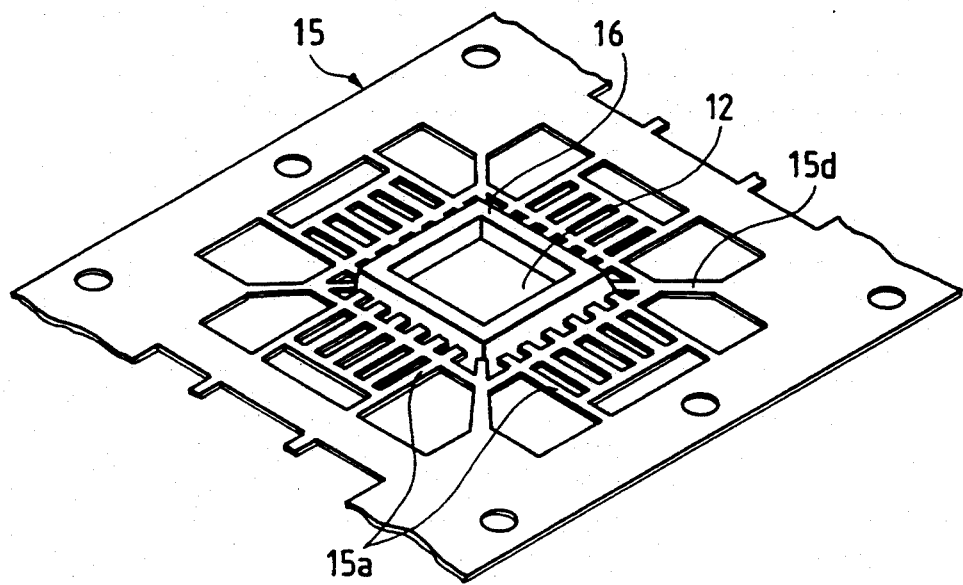
FIG. 8 is an diagonal view of the lead frame shown in FIG. 4 and the substrate of which the peripheries are reinforced with the first mold body shown in FIG. 1.

FIG. 8 is a diagonal view of the lead frame 15 and the substrate 12 of which the periphery is reinforced with the first mold body 16.

As shown in FIG. 8, the lead frame 15 and the substrate 12 are integrally connected. A method for forming the first mold body 16 is described later in detail with reference to FIGS. 12 to 15.

Figure 9A:
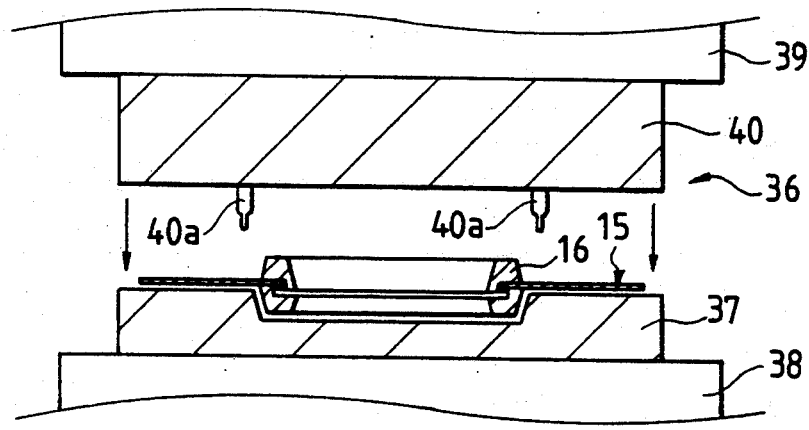
FIG. 9A is an sectional view of both the lead frame with the substrate shown in FIG. 7D and a cutting machine for cutting out first and second tie-bars shown in FIG. 4, showing the substrate shown in FIG. 7D and a cutting machine for steps 105, 106 of the method shown in FIG. 6.

In a step 105, as shown in FIG. 5A, the second tie-bars 15f are cut off from the lead frames 15 by cutting the second tie-bars 15f along dotted lines $D_1$ and dotted lines $D_2$. In detail, as shown in FIG. 9A, the second tie-bars 15f are cut by a cutting machine 36. That is, the lead frame 15 connected with the substrate 12 is accurately positioned on a die 37 of a drag 38 in the cutting machine 36. Thereafter, a cope 39 on which a punch 40 is attached is lifted down so that the second tie-bars 15f are cut off with cutting edges 40a of the punch 40.

In a step 106, the first tie-bars 15e are also cut off from the lead frame 15 by cutting the first tie-bars 15e along dotted lines $D_3$ to separate the conductive leads 15a from the lead frame 15. In detail, as shown in FIG. 9A, the first tie-bars 15e are cut off with the cutting edges 40a of the punch 40. In this case, the conductive leads 15a are firmly attached to the Substrate 12 by the solder layer 21 and the first mold body 16. Also, the substrate 12 are firmly connected with the lead frame 15 through the supporting bars 15d.

Figure 9B:
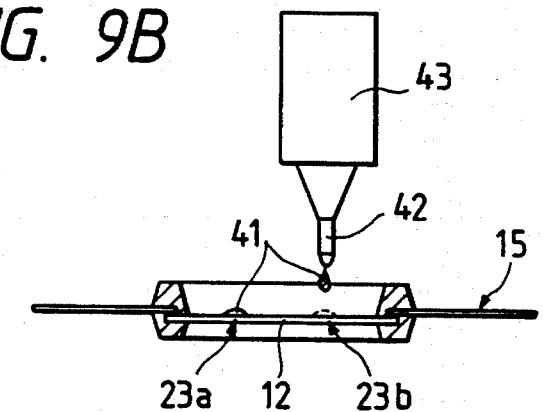
FIG. 9B explanatorily shows a step 107 of the method shown in FIG. 6.

In a step 107, adhesive agent 41 is coated on the islands 23a, 23b. In detail, as shown in FIG. 9B, the adhesive agent 41 filled in a bond dispenser 42 is discharged from a nozzle 43 of the bond dispenser 42 to the islands 23a, 23b by a regular volume.

Figure 9C:
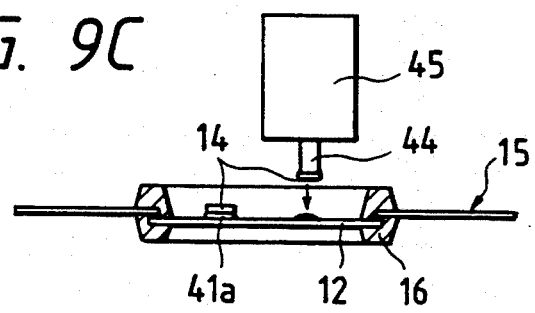
FIG. 9C explanatorily shows a step 108 of the method shown in FIG. 6.

In a step 108, the chips 14 are mounted on the islands 23a, 23b which are coated with the adhesive agent 41. In detail, as shown in FIG. 9C, each of the chips 14 is adsorbed by an evacuated nozzle 44 of a transferring head 45, and the chips 14 adsorbed are transferred over the islands 23a, 23b on the substrate 12. Thereafter, the nozzle 44 of the transferring head 45 are moved down so that the chips 14 are attached on the islands 23a, 23b through adhesive agent layers 41a.

Figure 9D:
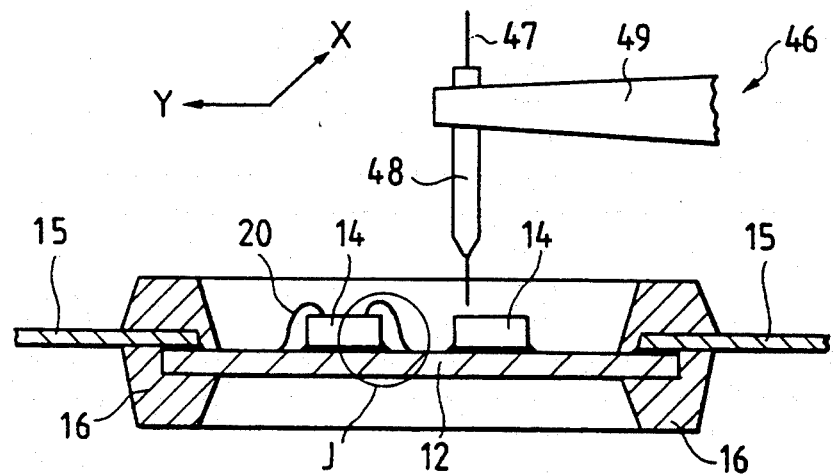
FIG. 9D explanatorily shows a step 109 of the method show in FIG. 6.
Figure 9E:
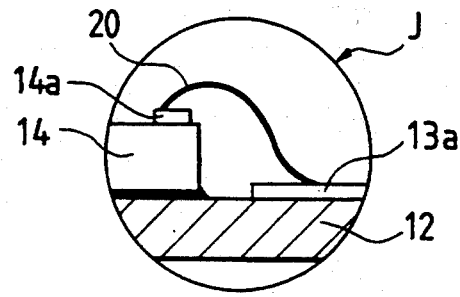
FIG. 9E enlarged view of a section J of the electronics package shown in FIG. 9D.

In a step 109, the electrodes 14a of the chips 14 are connected with the inner ends 13a of the patterned circuit 13 through the bonding wires 20 made of gold, by utilizing a bonding wiring equipment 46 shown in FIG. 9D. In detail, as shown in FIGS. 9D, 9E, a gold wire 47 is inserted into a capillary tool 48 supported on one end of a bonding horn 49 in the bonding wiring equipment 46. Thereafter, the capillary tool 48 is moved in an X direction and a Y direction on a horizontal plane. When the capillary tool 48 is positioned over one of the electrodes 14a of the chips 14, the capillary tool 48 is moved down, and the gold wire 47 is connected between one of the electrodes 14a and one of the inner ends 13a. This bonding process is repeated until all of the electrodes 14a of the chips 14 are connected with the inner ends 13a of the patterned circuit 13.

Figure 10:
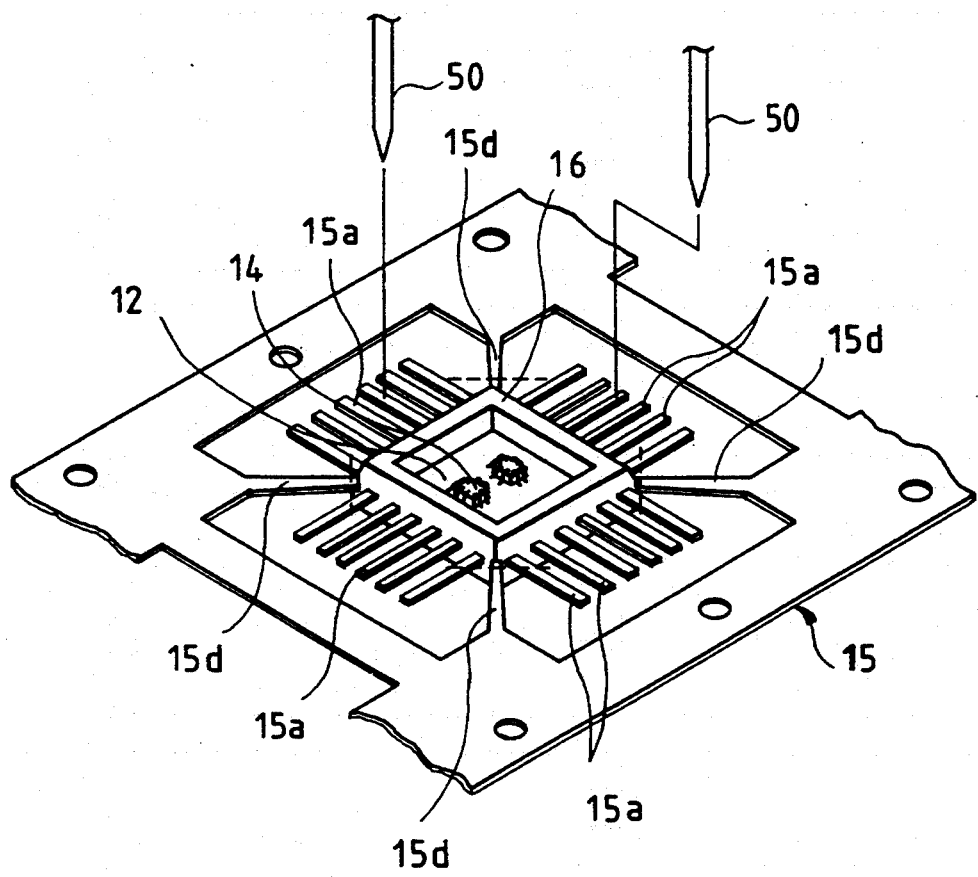
FIG. 10 is a diagonal view of the lead frame and the substrate on which each of the chips is electrically connected with lead lines cut out of the lead frame, explanatorily showing the step 110 of the method shown in FIG. 6.

FIG. 10 is a diagonal view of tile lead frame 15 and the substrate 12 on which each of the chips 14 is electrically connected with the lead lines 15a.

As shown in FIG. 10, the substrate 12 is supported by the lead frame 15 through the supporting bars 15d, and each of the chips 14 is electrically connected with the conductive leads 15a through the electrodes 14a, the bonding wires 20, and the patterned circuit 13.

Figure 9F:
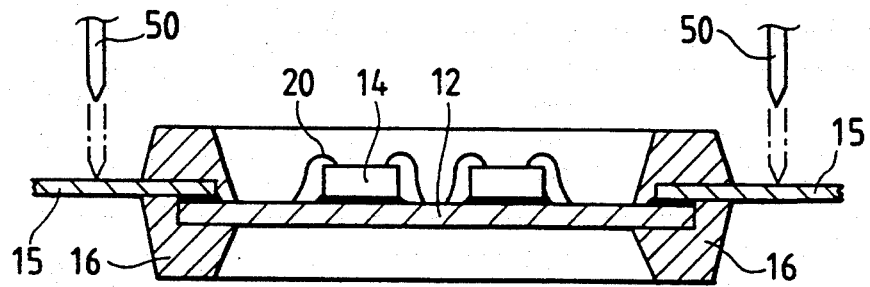
FIG. 9F explanatorily shows a step 110 of the method shown in FIG. 6.

In a step 110, a product inspection is implemented by utilizing a detecting apparatus to check whether or not the chips 14 properly function as electric parts. That is, as shown in FIGS. 9F, 10, a pair of probes 50 of the detecting apparatus is in contact with a pair of conductive leads 15a. In this case, the conductive leads 15a are separated from the lead frame 15. Therefore, when an electric signal is transferred between the conductive leads 15a through the probes 50, the conductivity between the conductive leads 15a, the insulation performance between the conductive leads 15a, the intensity change of electric current or voltage between the conductive leads 15a, or the like is detected or measured with the detecting apparatus without being disturbed by the lead frame 15. Therefore, it is possible to check whether or not each of the chips 14 in the electronics package 11 is defective.

For example, in cases where a bonding wire 20 is not tightly connected with either the electrode 14a of the chip 14 or the patterned circuit 13, the chip 14 to be connected with the bonding wire 20 is judged to be defective. Also, in cases where a chip 20 is not mounted on the island 23A or 23B, the chip 14 is judged to be defective. Also, in cases where a different type of chip 14 is erroneously attached on the substrate 12, the chip 14 is judged to be defective.

The product inspection is described in detail with reference to FIG. 11.

Figure 11:
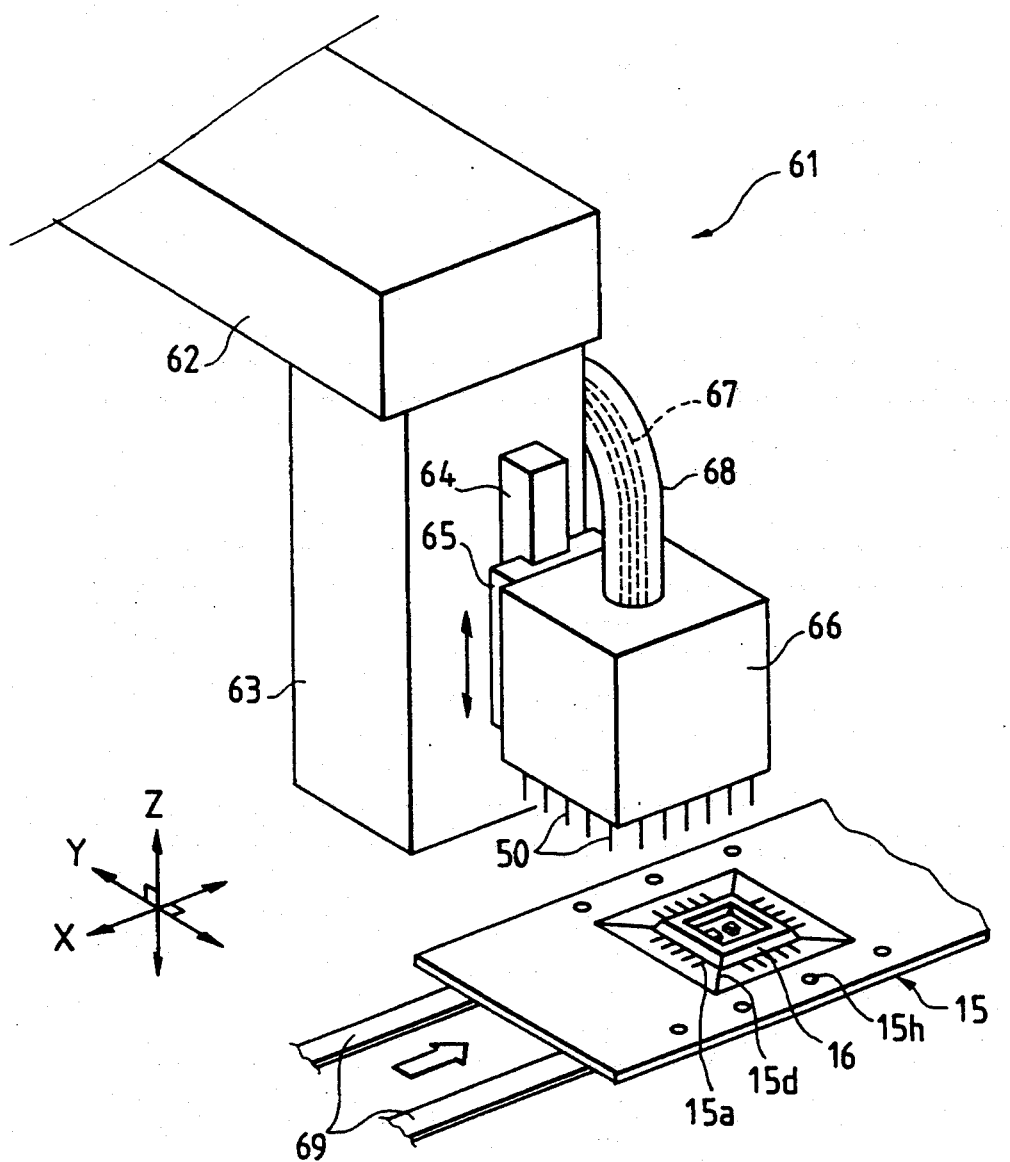
FIG. 11 is a diagonal view of a detecting apparatus, showing a process for inspecting the electronics package manufactured by the method shown in FIG. 6 according to a product inspection.

FIG. 11 is a diagonal view of a detecting apparatus, showing a process for inspecting the electronics package 11 according to the product inspection.

As shown in FIG. 11, a detecting apparatus 61 comprises an X-Y table 62 which is movable in both X and Y directions on a horizontal plane, a Z table 63 which is attached to one end of tile X-Y table 62 and downwardly extends in a Z direction, a guide rail 64 which is attached to one side of the Z-table 63 and extends in the Z direction, a slider 65 which is movably fitted on the guide rail 64 and is slid in the Z direction along the guide rail 64, a box type of holder 66 attached to the slider 65, a plurality of probes 50 which are orderly arranged on a bottom surface of the holder 66 in a matrix shape, a plurality of codes 67 which each are connected with one of the probes 50 to transfer an electric signal between one of the probes 50 and an electric signal processing section (not shown), and a cable 68 in which the codes 67 are accommodated.

In cases where the X-Y table 62 is moved in the X and Y directions, the Z table 63 is moved in the same manner. Therefore, the probes 50 arranged on the bottom surface of the holder 66 are moved in the X and Y directions in the same manner. Also, in cases where the slider 65 is slid in the Z direction independent of the movement of the X-Y table 62, the probes 50 arranged on the bottom surface of the holder 66 are moved in the Z direction in the same manner. In short, the proves 50 can be arbitrarily moved in the X, Y, and Z directions with the movement of the X-Y table 62 and the slider 65.

In the above configuration, the electronics package 11 attached to the lead frame 15 is transferred on a conveyer 69 along a detection line. When the electronics package 11 arrives at a position Just under the holder 66 of the detecting apparatus 61, the transference of the electronics package 11 is stopped. The position of the electronics package 11 is precisely found out by detecting the pin holes 15h adjacent to the electronics package 11 with a detector. Thereafter, the holder 66 is precisely positioned just above the electronics package 11 by the movement of the X-Y table 62. Thereafter, the holder 66 is moved down, and the probes 66 comes to contact with the conductive leads 15a of the electronics package 11. Thereafter, the chips 14 in the electronics package 11 are inspected.

In this case, because the electronics package 11 is integrally connected with the lead frame 15 through the supporting bars 15d, a plurality of electronics packages 11 which each are arranged at one block of the lead frame 15 can be stably transferred on the conveyer 69 by utilizing the lead frame 15 as a carrier of the electronics package 11.

Also, the lead frame 15 and the first mold body 16 protect the conductive leads 15a of the electronics package 11 from an obstacle erroneously arranged in the detecting line. Therefore, even though the electronics package 11 collides against the obstacle when the electronics package 11 is transferred or inspected, the conductive leads 15a can be prevented from being bent.

In a step 111, in cases where it is ascertained in the step 110 that at least one of the chips 14 in the electronics package 11 is defective, the procedure proceeds to a step 112.

In the step 112, the chip 14 ascertained to be defective is taken out of the substrate 12, and another chip 14 is newly attached to the substrate 12 according to the steps 107 to 109. Thereafter, the product inspection for the chip 14 newly attached is again implemented according to the step 110.

Accordingly, because a defective chip attached on the substrate 12 can be found out before the second mold body 17 is molded over the substrate 12 and the chips 14, a yield rate of tile electronics package 12 can be increased.

In contrast, in cases where it is ascertained in the step 110 that all of the chips 14 in the electronics package 11 are non-defective, the procedure proceeds to a step 113.

Figure 9G:
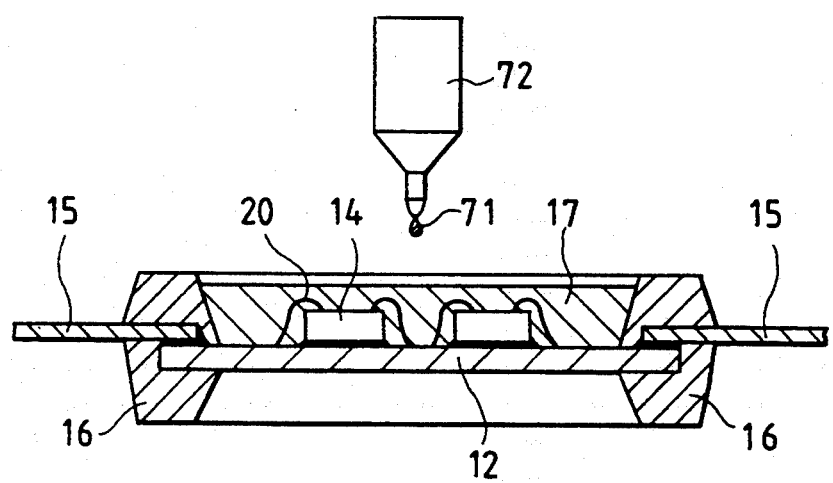
FIG. 9G explanatorily shows a step 113 of the method shown in FIG. 6.
Figure 9H:
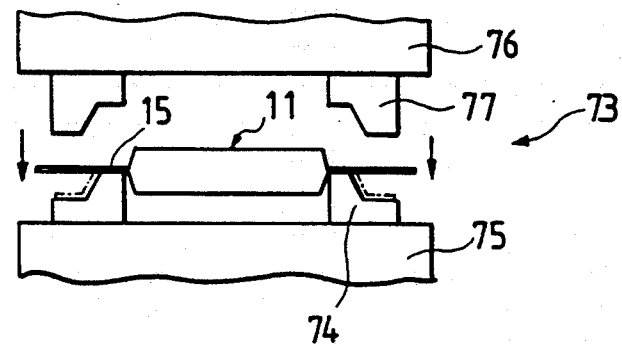
FIG. 9H explanatorily shows a step 114 of the method shown in FIG. 6.

In the step 113, the second mold body 17 is molded over the substrate 12 and the chips 14. In detail, as shown in FIG. 9G, a paste type of synthetic resin 71 filled in a resin dispenser 72 is applied on the substrate 12 surrounded by the first mold body 16. Therefore, the chips 14 attached on the substrate 12 are covered by the synthetic resin 71. After a time, the synthetic resin 71 is solidified, and the second mold body 17 is formed on tile substrate 12.

Accordingly, the chips 14 and the bonding wires 20 are protected from a mechanical collision and corrosive gases.

In a step 114, the conductive leads 15a are respectively bent in a L-shaped cross section by utilizing a press working machine 73 shown in FIG. 911. In detail, the electronics package 11 is mounted on a lower die 74 of a drag 75 in the press working machine 73. Thereafter, a cope 76 of the machine 73 is moved down to put the electronics package 11 between the lower die 74 and an upper die 77 of the cope 76. Therefore, the electronics package 11 is pressed by the machine 73 to bent the conductive leads 15a in L shape.

Figure 9I:
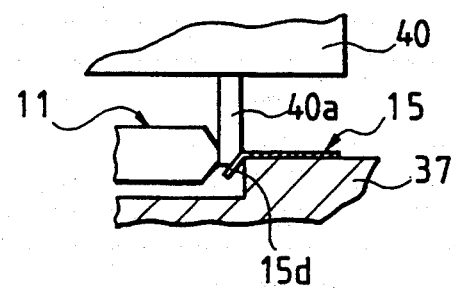
FIG. 9I explanatorily shows a step 115 of the method shown in FIG. 6.

In a step 115, the electronics package 11 is separated from the lead frame 15. In detail, as shown in FIGS. 5A, 9I, the supporting bars 15d are cut off from the electronics package 11 along dotted lines D4 by utilizing the cutting machine 36 shown in FIG. 9A.

As a result, the electronics package 11 is completely manufactured according to tile method shown in FIG. 6.

Next, the formation of the first mold body 16 molded in the step 104 is described in detail with reference to FIGS. 12 to 15.

Figure 12:
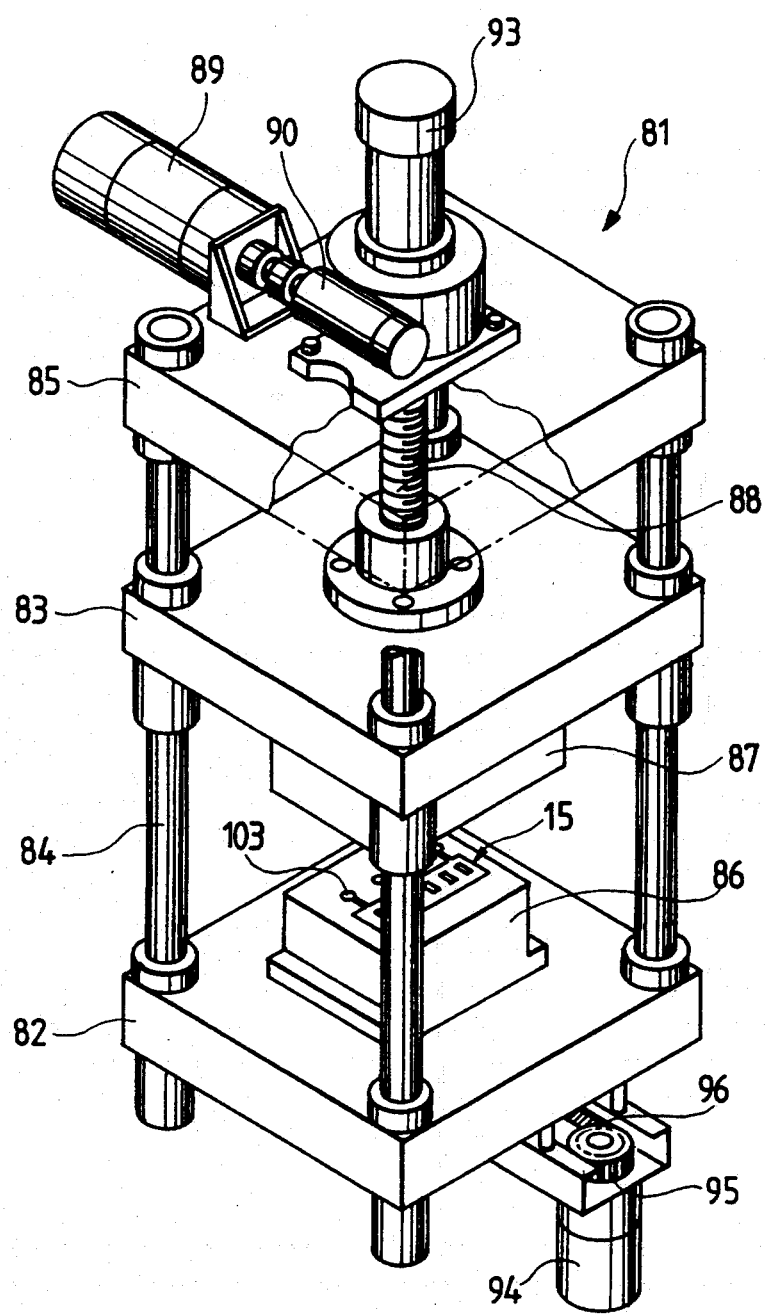
FIG. 12 is a diagonal view of a mold press machine for molding the first mold body shown in FIG. 1.
Figure 13:
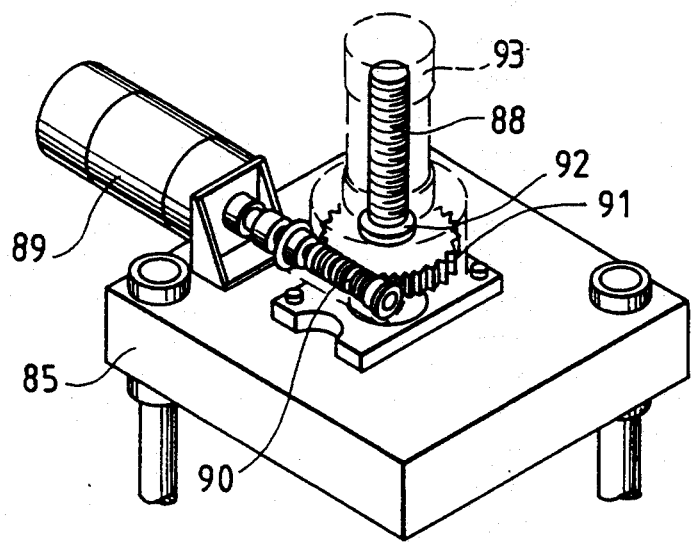
FIG. 13 is an enlarged view of an upper portion of the mold press machine shown in FIG. 12, perspectively showing a mechanism of and up-and-down motion of a platen.

FIG. 12 is a diagonal view of a mold press machine by which the first mold body 16 is molded. FIG. 13 is an enlarged view of an upper portion of the mold press machine shown in FIG. 12, perspectively showing a mechanism of an up-and-down motion of a platen.

As shown in FIG. 12, a mold press machine 81 comprises a base plate 82, a platen 83 arranged just above the base plate 82 at a changeable distance from the base plate 82, four guide rods 84 vertically arranged at four corners of the base plate 82 for guiding the platen 83 in a vertical direction, a top plate 85 arranged just above the platen 83 at a fixed distance from the base plate 82, a drag 86 attached on an upper surface of the base plate 82, a cope 87 attached on a lower surface of the platen 83, and a ball screw 88 vertically extending from a central portion of the platen 83 to a central portion of the top plate 85.

The platen 83 and the cope 87 attached to the platen 83 is moved up and down together between the base plate 82 and the top plate 85 when the ball screw 88 is moved up and down.

The drag 86 and the cope 87 face each other. The lead frame 15 in which a plurality of substrates 12 are arranged in line is mounted on the drag 86. Therefore, in cases where the platen 83 is moved down, the lead frame 15 is tightly put between the drag 86 and the cope 87.

As shown in FIG. 13, the machine 81 additionally comprises an AC servo motor 89 arranged on the top plate 85, a speed reducing worm 90 attached to the AC servo motor 89, a worm wheel 91, a nut 92 which is arranged inside of the worm wheel 91 and is fitted to the ball screw 88, and a cover case 93 for covering an upper end of the ball screw 88 and the worm wheel 91.

Driving energy generated in the AC servo motor 89 is transferred to the worm wheel 91 through the speed reducing worm 90 while reducing a rotational speed determined by the motor 89 with the worm 90 and the worm wheel 91. Therefore, in cases where the AC servo motor 89 is driven, the speed reducing worm 90, the worm wheel 91, and the nut 92 are rotated, and the ballscrew 88 is slowly rotated according to the rotation of the nut 92. As a result, the ball screw 88 is moved up or down so that the platen 83 and the cope 87 are moved up or down together.

Figure 14:
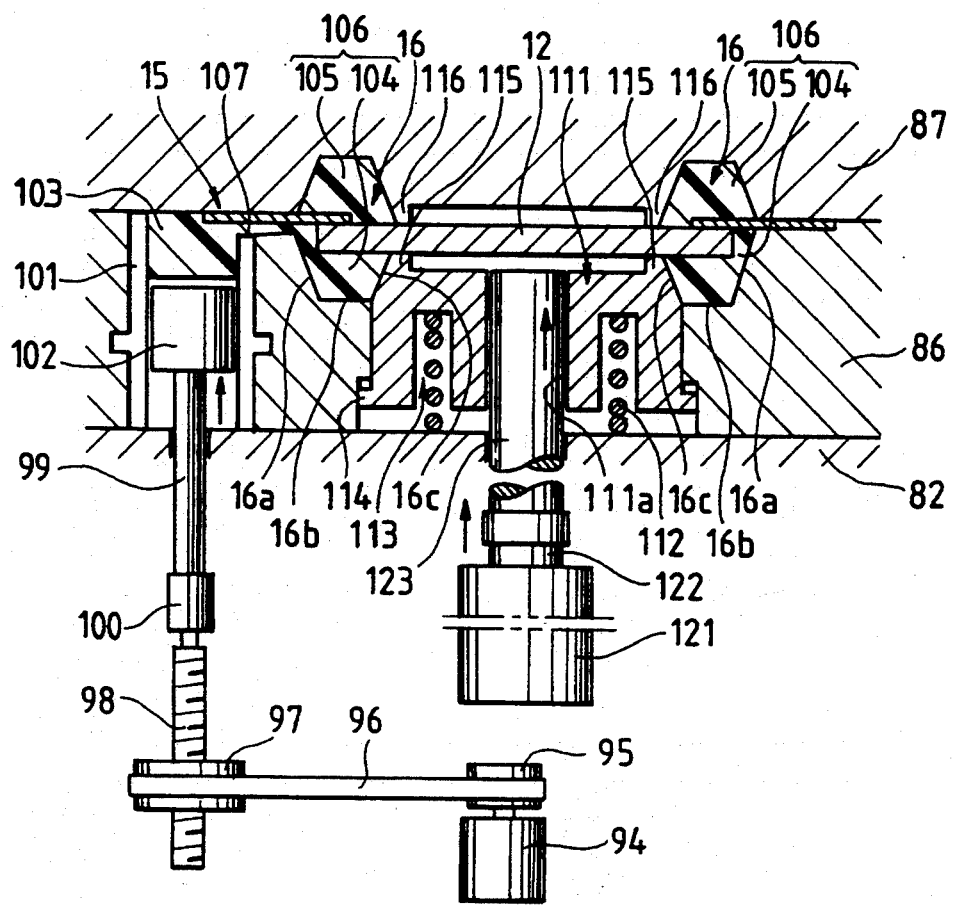
FIG. 14 is a cross sectional view of a drag and a cope shown in FIG. 12 which are in contact with each other, explanatorily showing synthetic resin filled in a cavity to form the second mold body shown in FIG. 1.

FIG. 14 is a cross sectional view of the drag 86 and the cope 87 which are in contact with each other, showing the formation of the first mold body 16.

As shown in FIGS. 12, 14, the machine 81 additionally comprises an AC servo motor 94 arranged under the base plate 82, a pulley 95 rotated by the motor 94, a belt 96 wound on the pulley 95, a nut 97 rotated by the movement of the belt 96, a ball screw 98 which is fitted to the nut 97 and is vertically moved according to the rotation of the nut 97, a rod 99 vertically moved with tile ball screw 98, a coupling 100 for connecting the rod 99 with the ball screw 98, a cylindrical casing 101 arranged in the drag 86a, a plunger 102 which is attached to an upper end of the rod 99 and is moved up and down in the cylindrical casing 101 according to the motion of the rod 99.

In the above configuration, a tablet type of synthetic resin 103 is set in the casing 102 when the cope 87 is arranged at an upper position. Thereafter, the synthetic resin 103 is heated and melted by a heater (not shown) arranged in a side surface of the casing 101. Also, the lead frame 15 with the substrates 12 is set on the drag 86.

Thereafter, the cope 87 is moved down while driving the AC servo motor 89. Therefore, as shown in FIG. 14, the lead frame 15 is put between the drag 86 and the cope 87. Thereafter, the motor 94 is driven to produce torques in a forward direction so that the torques produced by the motor 94 is transmitted to the plunger 102 through the pulley 95, the belt 96, the nut 97, the ball screw 98, and the rod 99. Therefore, the plunger 102 is moved up to press the synthetic resin 103 melted in the casing 103.

In this case, a first groove 104 is dug in the drag 86 along the periphery of each of the substrates 12 arranged in line. Also, a second groove 105 facing the first groove 104 is formed in the cope 87 for each of the substrates 12. Therefore, when the lead frame 15 is put between the drag 86 and the cope 87, a doughnut-shaped cavity 106 is formed of the first and second grooves 104, 105 along the periphery of each of the substrates 12. In addition, an opening 107 is formed in the side surface of the casing 101. Therefore, the synthetic resin 103 filled in the casing 101 can be transferred to the cavity 106 through the opening 107.

When the plunger 102 is moved up, the synthetic resin 103 is gradually pushed out of the casing 101 to the cavities 106 through the opening. When the cavities 106 are filled up with the synthetic resin 103, the torques produced by the motor 94 are reduced to pressurize the synthetic resin 103 filled in the cavities 106 at a low pressure. Thereafter, the synthetic resin 103 filled in the cavities 106 is cured and solidified. Therefore, the first mold body 16 is molded in each of the cavities 106.

After the first mold body 16 is molded in each of the cavities 106, the plunger 102 is moved down by driving the motor 94 in a reverse direction. Thereafter, the cope 87 is moved up by driving the AC servo motor 89.

As shown in FIG. 14, tile machine 81 additionally comprises a spring-loaded block 111 having a plurality of penetrating holes 111a which is arranged in the drag 86 and is positioned just under the substrates 12 arranged in line on the drag 86. Each of the penetrating holes 111a is positioned just under a central portion of each of the substrates 12.

The block 111 is provided with a block spring 112 arranged in a cylindrical hole 113 thereof for forcing the block 111 to lift, a side flange 114 for stopping the block 111 lifted by a spring action of tile block spring 112 at a highest position, and a first ring-shaped projecting portion 115 arranged along an upper edge of the block 111 for receiving the substrates 12.

In the above configuration, in cases where the cope 87 is arranged at the upper position, the block 111 is lifted by the spring action of the block spring 112 to the highest position. In contrast, in cases where the cope 87 is moved down to put the lead frame 15 between the drag 86 and the cope 87, the block 111 is forcibly moved down to a lowest position by the cope 87 while overriding the spring action of the block spring 112.

In this case, each of the substrates 12 is put between the first projecting portion 115 of the block 111 and a second ring-shaped projecting portion 116 arranged on the cope 87.

Accordingly, even though each of the substrates 12 has an uneven surface, the substrates 12 can be stably received by the first and second ring-shaped projecting portions 115, 116.

Also, because the block 111 is supported by the block spring 112, the block 111 can be inclined to horizontally put the lead frame 15 between the drag 86 and the cope 87 even though the substrates 12 do not have flat surfaces. Therefore, in cases where the lead frame 15 is put between the drag 86 and the cope 87, the cavities 106 can be reliably sealed between the drag 86 and the cope 87.

Figure 15:
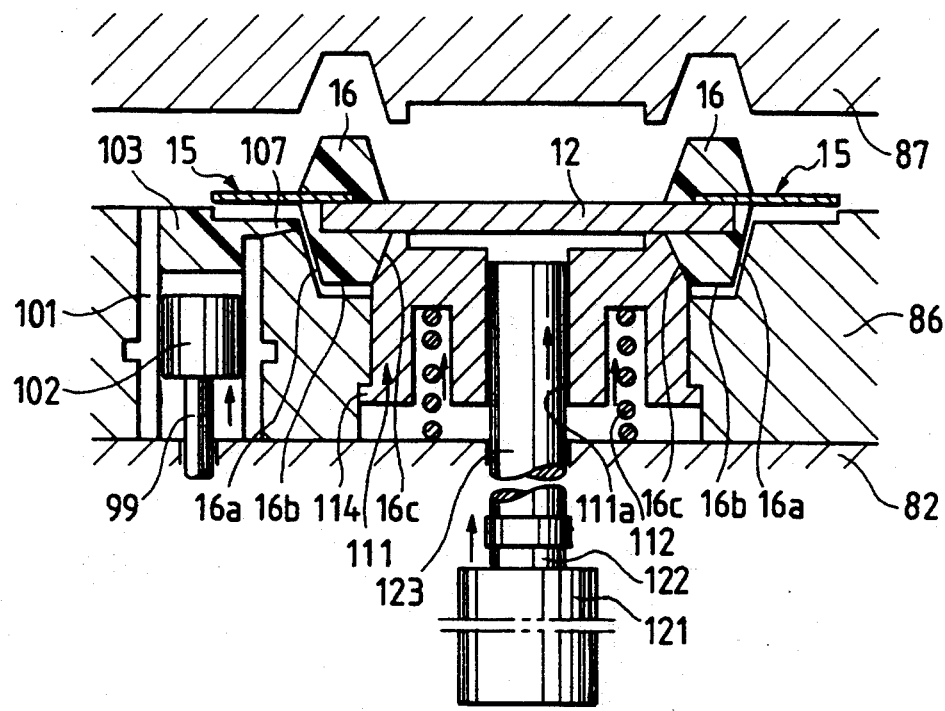
FIG. 15 is a cross sectional view of the drag and the cope shown in FIG. 12, explanatorily showing the separation of the first mold body from the cope in cases where the cope is moved up after the second mold body is formed.

When the cope 87 is moved up by driving the AC servo motor 89 after the first mold bodies 16 are molded in the cavities 106, upper surfaces of the first mold bodies 16 are separated from the second grooves 105 of the cope 87. At the same time, the block 111 is lifted by the spring action of the block spring 112 to the highest position. Therefore, the substrates 12 are also lifted. In this case, as shown in FIG. 15, because the first mold bodies 16 molded in the cavities 106 are also lifted, outside surfaces 16a of the first mold bodies 16 and bottom surfaces 16b of the first mold bodies 16 are separated from the first grooves 104 of the drag 86 (a first separating step). However, inside surfaces 16c of the first mold bodies 16 are still attached to the block 111.

As shown in FIGS. 14, 15, the machine 81 additionally comprises a cylinder 121 in which a plurality of pistons are reciprocated, a plurality of rods 122 moved up and down according to the motion of the pistons of the cylinder 121, and a plurality of ejector pins 123 which each are inserted into one of the penetrating holes 111a of the block 111 and are moved up and down according to the motion of the rods 122.

In the above configuration, after the substrate 12 is lifted to separate the outside and bottom surfaces 16a, 16b of the first mold body 16 from the first grooves 104 of the drag 86, the cylinder 121 is driven to move up the ejector pins 123 in the penetrating holes 111a of the block 111. In this case, because the central portions of the substrates 12 are positioned just above the penetrating holes 111a, the substrates 12 are pushed up by the ejector pins 123 in balance when the ejector pins 123 are moved up. Therefore, the inside surfaces 16c of the first mold bodies 16 are separated from the first grooves 104 (a second separating step). In other words, the first mold bodies 16 are completely separated from the drag 86, the cope 87, and the block 111.

Accordingly, because the first mold bodies 16 are separated from the drag 86 according to the first and second separating steps, the first mold bodies 16 can be reliably separated from the drag 86 as compared with a method in which the first mold bodies 16 are separated according to the only second separating step.

Also, because excess stress is not applied to the first mold bodies 16 in cases where the first mold bodies 16 are separated according to the first and second separating steps, the first mold bodies 16 are not damaged by the separation from the drag 86.

In conclusion, the first mold bodies 16 can be easily and reliably formed along the peripheries of the substrates 12 by utilizing the mold press machine 81.

Next, the composition of the solder layer 21 utilized to connect the conductive leads 15a with the outer ends 13b of the patterned circuit 13 is described in detail.

Normal solder is generally formed of an alloy of 37 W/W % lead and 63 W/W % tin so that a melting point of the normal solder ranges from 180° C. to 200° C. In contrast, the tablet type of synthetic resin 103 set in the casing 101 is heated to 180° C. to 190° C. to melt the synthetic resin 103.

Therefore, in cases where the normal solder is utilized to connect the conductive leads 15a with the outer ends 13b of the patterned circuit 13, the synthetic resin 103 heated to the temperature of 180° C. to 190° C. melts the normal solder. Therefore, there is a probability that the conductive leads 15a come off from the outer ends 13b of the patterned circuit 13.

In the present invention, the solder layer 21 is formed of an alloy of 96.5 W/W % tin and 3.5 W/W % silver.

In this case, a melting point of the solder layer 21 is about 221° C. Therefore, the melting point of the solder layer 21 is higher enough than that of the synthetic resin 103.

Accordingly, because the solder layer 21 is melted at a comparatively high temperature, there is no probability that the conductive leads 15a come off from the outer ends 13b of the patterned circuit 13.

2. Second Embodiment

A second embodiment is described with reference to FIG. 16.

Constructional elements which are the same as those shown in FIG. 2 are denoted by the same reference numerals as those shown in FIG. 2.

Figure 16:
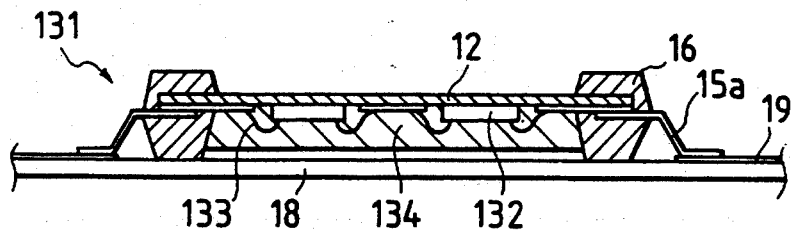
FIG. 16 is a sectional view of an electronics package according to a second embodiment.

FIG. 16 is a sectional view of an electronics package according to a second embodiment.

As shown in FIG. 16, an electronics package 131 according to the second embodiment comprises the substrate 12, the conductive leads 15a connected to the patterned circuit 13 printed on the substrate 12, the first mold body 16 reinforcing the connection between the substrate 12 and the conductive leads 15a, a plurality of chips 132 attached on a lower surface of the substrate 12, a plurality of bonding wires 133 for connecting the chips 132 with the patterned circuit 13, and a second mold body 134 covering the chips 132 and the bonding wires 133. The electronics package 131 is mounted on the main substrate 18 to connect the conductive leads 15a with the main patterned circuit 19 printed on the main substrate 18.

In the above configuration, the chips 132 functioning as electronic parts are arranged at the lower surface of the substrate 12. As a result, no element is arranged on the substrate 12. In other words, the substrate 12 has a flat upper surface.

Therefore, in cases where the electronics package 131 is mounted on the main substrate 18, the flat surface of the substrate 12 is adsorbed by an evacuated nozzle of a chip mounting head without being disturbed by any element.

Accordingly, as compared with the electronics package 11 according to the first embodiment, the electronics package 131 can be easily mounted on the main substrate 18.

3. Third Embodiment

A third embodiment is described with reference to FIGS. 17, 18.

Figure 17:
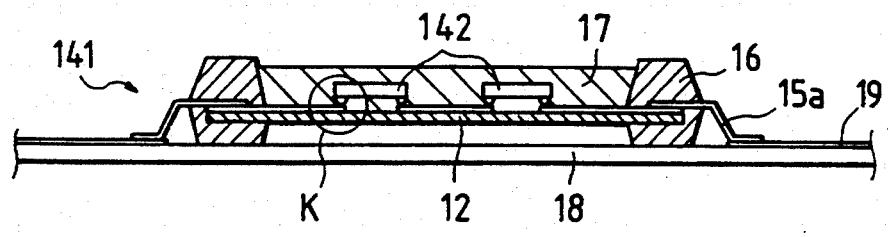
FIG. 17 is a sectional view of an electronics package according to a t embodiment.
Figure 18:
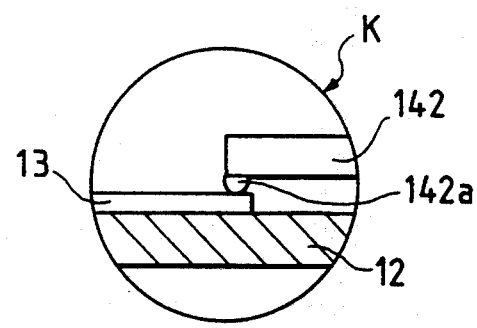
FIG. 18 is an enlarged view of a section K of the electronics package shown in FIG. 17.

FIG. 17 is a sectional view of an electronics package according to a third embodiment. FIG. 18 is an enlarged view of a section K of the electronics package shown in FIG. 17.

As shown in FIG. 17, an electronics package 141 according to the third embodiment comprises the substrate 12, the conductive leads 15a connected to the patterned circuit 13 printed on the substrate 12, the first mold body 16 reinforcing the connection between the substrate 12 and the conductive leads 15a, a plurality of flip chips 142 attached on the upper surface of the substrate 12, and the second mold body 17 covering the flip chips 142 and the bonding wires 20. The electronics package 141 is mounted on the main substrate 18 to connect the conductive leads 15a with the main patterned circuit 19 printed on the main substrate 18. Each of the flip chips 142 has a plurality of bumps 142a functioning as projected electrodes on a lower surface thereof. The bumps 142a of the flip chips 142 are arranged between the flip chips 142 and the inner ends 13*a* of the patterned circuit 13, as shown in FIG. 18.

In the above configuration, the flip chips 142 are electrically and mechanically connected with the patterned circuit 13 through the bumps 142*a* even though no bonding wire is connected between the flip chips 142 and the patterned circuit 13. In this case, the bumps 142*a* are attached to the patterned circuit through conductive adhesive agent.

Accordingly, the electronics package 141 can be easily manufactured as compared with the electronics package 11 according to the first embodiment.

4. Fourth Embodiment

A fourth embodiment is described with reference to FIG. 19.

Figure 19:
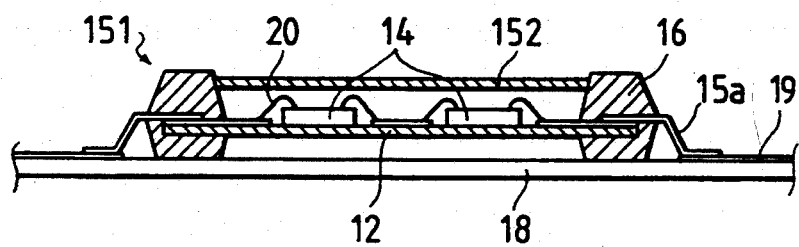
FIG. 19 is a sectional view of an electronics package according to fourth embodiment.

FIG. 19 is a sectional view of an electronics package according to a fourth embodiment.

As shown in FIG. 19, an electronics package 151 according to the fourth embodiment comprises the substrate 12, the conductive leads 15*a* connected to the patterned circuit 13 printed on the substrate 12, the first mold body 16 reinforcing the connection between the substrate 12 and the conductive leads 15*a*, the chips 14 attached on the upper surface of the substrate 12, and a covering plate 152 arranged over the chips 14 and the bonding wires 133. The covering plate 52 is attached to the first mold body 16 through adhesive agent applied on a surface of the first mold body 16. The electronics package 151 is mounted on the main substrate 18 to connect the conductive leads 15*a* with the main patterned circuit 19 printed on the main substrate 18.

The covering plate 152 protects the chips 14 and the bonding wire 20 from an external shock and a corrosive gas. Therefore, no mold body such as the second mold body 17 is required in the fourth embodiment.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method of manufacturing an electronics package, comprising the steps of:
   preparing a substrate on which a patterned circuit is provided;
   preparing a lead frame comprising a plurality of conductive leads, a tie-bar with which the conductive leads are tied, and a supporting bar;
   mounting the substrate on the lead frame to connect the patterned circuit on the substrate to the conductive leads of the lead frame;
   forming an insulating mold body along a periphery of the substrate to cover a connecting portion placed between the patterned circuit and the conductive leads, the supporting bar of the lead frame being fixed to the substrate by the insulating mold body;
   cutting off the tie-bar of the lead frame from the lead frame;
   mounting at least one chip on the substrate to connect an inner circuit of the chip to the patterned circuit on the substrate;
   mounting an insulating protector over the chip to protect the chip from an external obstacle; and
   cutting off the supporting bar of the lead frame from the substrate, thereby manufacturing an electronics package which comprises the substrate, the conductive leads, the chip, the insulating mold body, and the insulating protector.

2. A method according to claim 1 in which the step of mounting the substrate on the lead frame includes:
   applying creamed solder on outer ends of the patterned circuit provided on the substrate;
   mounting the lead frame on the substrate, the creamed solder being put between the conductive leads and the outer ends of the patterned circuit;
   heating the creamed solder to melt the creamed solder; and
   cooling the creamed solder to solidify solder included in the creamed solder.

3. A method according to claim 1 in which the step of forming an insulating mold body includes:
   preparing a drag in which a spring-loaded block is arranged and a ring-shaped first groove is dug to surround the spring-loaded block, a ring-shaped first projecting portion being arranged at upper edge of the spring-loaded block;
   preparing a cope facing the drag, the cope being moved up and down to change a distance between the drag and the cope, a second groove being drug in the cope to face the first groove of the drag, and a second projecting portion being arranged on the cope to face the first projecting portion of the drag;
   preparing a casing in which a plunger is moved up and down, a hole being formed at a side of the casing to form an opening reaching from the casing to the first groove of the drag;
   setting the substrate attached to the lead frame on the spring-loaded block, the lead frame being mounted on the drag;
   putting a tablet type of synthetic resin on the plunger in the casing;
   heating the tablet type of synthetic resin to melt the synthetic resin;
   moving down the cope to put the lead frame between the drag and the cope, the substrate being put between the first projecting portion of the drag and the second projecting portion of the cope, and a cavity being formed of the first groove of the drag and the second groove of the cope;
   moving up the plunger to push out the synthetic resin to the cavity through the opening;
   cooling the synthetic resin filled in the cavity to solidify the synthetic resin, the insulating mold body being formed of the synthetic resin solidified in the cavity;
   moving up the cope to separate an upper surface of the insulating mold body packed in the cavity from the cope, outside and bottom surfaces of the insulating mold body being separated from the drag by a spring action of the spring-loaded block;
   lifting the substrate by pushing up a back surface of the substrate with an ejector pin, an inside surface of the insulating mold body being separated from the spring-loaded block; and
   taking out the substrate mounted on the spring-loaded block, the insulating mold body being formed along the periphery of the substrate.

4. A method according to claim 1 in which the step of mounting at least one chip includes:
   coating adhesive agent on the substrate;
   mounting the chip on the substrate coated with the adhesive agent to attach the chip on the substrate; and arranging an insulating wire between the inner circuit of the chip and the patterned circuit.

5. A method according to claim 1 in which the step of mounting at least one chip includes:
coating insulating adhesive agent on the substrate; and
mounting a flip chip on the substrate to attach bumps arranged on the flip chip to the patterned circuit through the insulating adhesive agent.

6. A method according to claim 1 in which the step of mounting an insulating protector includes:
applying a paste type of synthetic resin on the substrate to cover over the chip; and
solidifying the paste type of synthetic resin, the insulating protector being formed of the synthetic resin solidified.

7. A method according to claim 1 in which the step of mounting an insulating protector includes:
applying adhesive resin on a surface of the insulating mold body surrounding the substrate; and
setting an insulating plate over the substrate while attaching the insulating plate on the surface of the insulating mold body on which the adhesive resin is applied.

8. A method according to claim 1 additionally including: implementing a product inspection to check whether or not the chip properly functions before the step of arranging an insulating protector.

9. A method according to claim 8 in which the step of implementing a product inspection includes:
transferring the substrate just under a pair of probes;
contacting the probes with a pair of conductive leads to which the chip is connected; and
transferring an electric current from one of the probes to another probe to measure or detect an electric performance of the chip.

10. A method of manufacturing an electronics package, comprising the steps of:
preparing a substrate on which a patterned circuit is provided;
preparing a conductive lead frame in which a plurality of conductive lead members, a tie-bar member tying the conductive lead members and a supporting bar member are formed, the conductive lead frame, the conductive lead members and the bar members being made of a conductive material;
mounting the substrate on the conductive lead frame to connect the patterned circuit on the substrate to the conductive lead members of the conductive lead frame;
forming an insulating mold made of an insulating material along a periphery of the substrate to cover a connecting portion placed between the patterned circuit on the substrate and the conductive lead members, the conductive lead members being tightly fixed to the substrate by the insulating mold;
cutting the tie-bar member of the conductive lead frame from the conductive lead members to separate the conductive lead members from each other;
mounting at least one chip on the substrate to electrically connect an inner circuit of the chip to the patterned circuit on the substrate;
implementing a product inspection in which an electric inspecting apparatus is brought into contact with the conductive lead members projecting from the substrate to check whether or not a signal transmits from a conductive lead member to another conductive lead member through the chip;
mounting an insulating guard member made of an insulating material over the chip on the substrate; and
cutting the supporting bar member of the conductive lead frame from the substrate.

11. A method according to claim 10 in which the step of implementing a product inspection includes:
transferring the substrate just under a pair of probes of the electric inspecting apparatus;
contacting the probes with a pair of conductive lead members; and
flowing an electric current from one of the probes to the other probe to measure or detect an electric performance of the chip.

12. A method according to claim 10 in which the step of implementing a product inspection includes:
inspecting conductivity between the conductive lead members;
inspecting insulation performance between the conductive lead members; and
inspecting intensity change of electric current or voltage between the conductive lead members.

* * * * *